(12) United States Patent
Sarno et al.

(10) Patent No.: US 6,394,815 B1
(45) Date of Patent: May 28, 2002

(54) CONNECTING DEVICE FOR AN ASSEMBLY OF LINE REPLACEABLE MODULES FOR ELECTRONIC WALLETS AND RACK EQUIPPED WITH SAME FOR RECEIVING SUCH AN ASSEMBLY

(75) Inventors: Claude Sarno, Etoile S/Rhone; Henri Bouteille, Beaumont les Valence, both of (FR)

(73) Assignee: Thomson-CSF Sextant, Velizy Villacoublay (FR)

( * ) Notice: Subject to any disclaimer, the term of this patent is extended or adjusted under 35 U.S.C. 154(b) by 0 days.

(21) Appl. No.: 09/786,354

(22) PCT Filed: Sep. 10, 1999

(86) PCT No.: PCT/FR99/02161

§ 371 (c)(1),
(2), (4) Date: Mar. 13, 2001

(87) PCT Pub. No.: WO00/16599

PCT Pub. Date: Mar. 23, 2000

(30) Foreign Application Priority Data

Sep. 15, 1998 (FR) .............................. 98 11499

(51) Int. Cl.⁷ ................................................ H01R 9/09
(52) U.S. Cl. ........................................ 439/61; 361/788
(58) Field of Search ................................. 361/413, 788, 361/785, 683; 439/61

(56) References Cited

U.S. PATENT DOCUMENTS

| | | | |
|---|---|---|---|
| 4,179,172 A | 12/1979 | Godsey et al. | |
| 4,420,793 A | * 12/1983 | Strabdberg | .................. 361/413 |
| 5,348,482 A | 9/1994 | Rudy, Jr. et al. | |
| 6,144,561 A | * 11/2000 | Cannella, Jr. | ............... 361/788 |

FOREIGN PATENT DOCUMENTS

DE  2 491 716  4/1982

OTHER PUBLICATIONS

IBM (vol. 19, No. 1, Jun. 1976) D. V. Allen, D. F. Homan and G. L. Kehley.*

* cited by examiner

*Primary Examiner*—Tulsidas Patel
*Assistant Examiner*—Phuong K T Dinh
(74) *Attorney, Agent, or Firm*—Oblon, Spivak, McClelland, Maier & Neustadt, P.C.

(57) ABSTRACT

A device for connecting an array of electronic-card-carrying modular structures to an external installation with which a flow of signals can be established, and also providing communication between the various modular structures. The device includes, near the array of modular structures, a plate provided with openings, terminal connection blocks coming from the installation, which should each be inserted into the openings and coupled directly to a connection block carried by a modular structure of the array and, fastened to the plate, a circuit for distributing signals between various modular structures, which is protected from the ambient environment. Such a device may find particular application to aircraft.

15 Claims, 4 Drawing Sheets

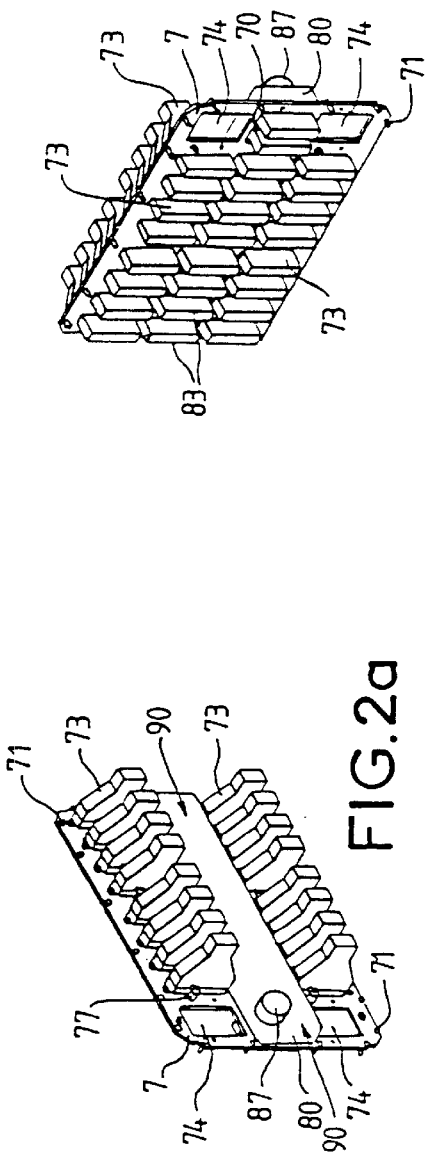
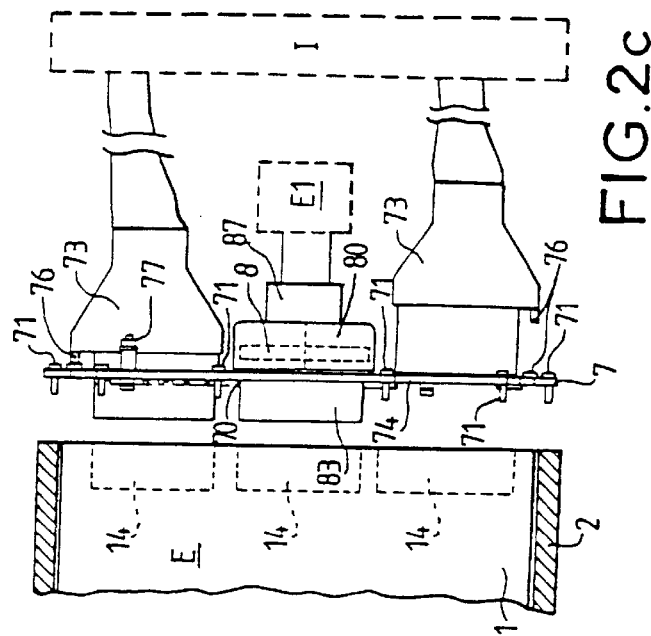
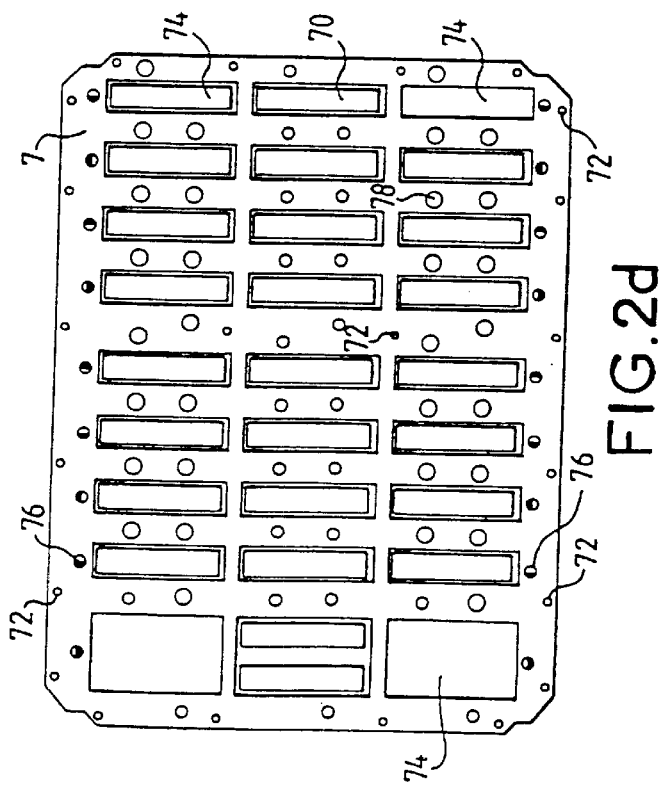

CONNECTING DEVICE FOR AN ASSEMBLY OF LINE REPLACEABLE MODULES FOR ELECTRONIC WALLETS AND RACK EQUIPPED WITH SAME FOR RECEIVING SUCH AN ASSEMBLY

The present invention relates to a connection device intended for an array of electronic-card-holding modular structures. These modular structures are known by the name LRM standing for Line Replaceable Module.

Such a modular structure comprises a case containing one or more electronic cards and is provided with at least one connection block, which has to cooperate with the connection device, in order to provide a link between the electronic cards and an external installation with which a flow of signals can be established. The term "electronic card" encompasses all substrates on which electronic components such as printed circuits may be interconnected, ceramic substrates, silicon substrates, etc. The modular structures of the array are usually grouped together in a rack.

The external installation may, but not exclusively, be located on board an aircraft. In this application, signals pass between one or more racks and the various components of the aircraft, such as, for example, the flaps, the control surfaces, the landing gear, the navigation instruments, various pressure and temperature sensors, etc.

These signals are not exclusively electrical signals—they may be optical signals for example. In the modular structures, the signals are processed by the electronic cards. A communication is thus established between electronic cards of the same modular structure or of various modular structures.

In modern aircraft, the components capable of delivering or receiving such signals are extremely numerous and, in addition, the concept of integrated modular avionics, which is tending to replace distributed electronic functions by centralized racks, has a concentrating effect on the signals. Consequently, it is possible for several thousands of conductors conveying these signals to arrive close to the modular structures located in the rack.

The problems encountered are therefore numerous—they occur especially at the moment of connecting the conductors to the modular structures but also when carrying out troubleshooting work.

Figure 1:
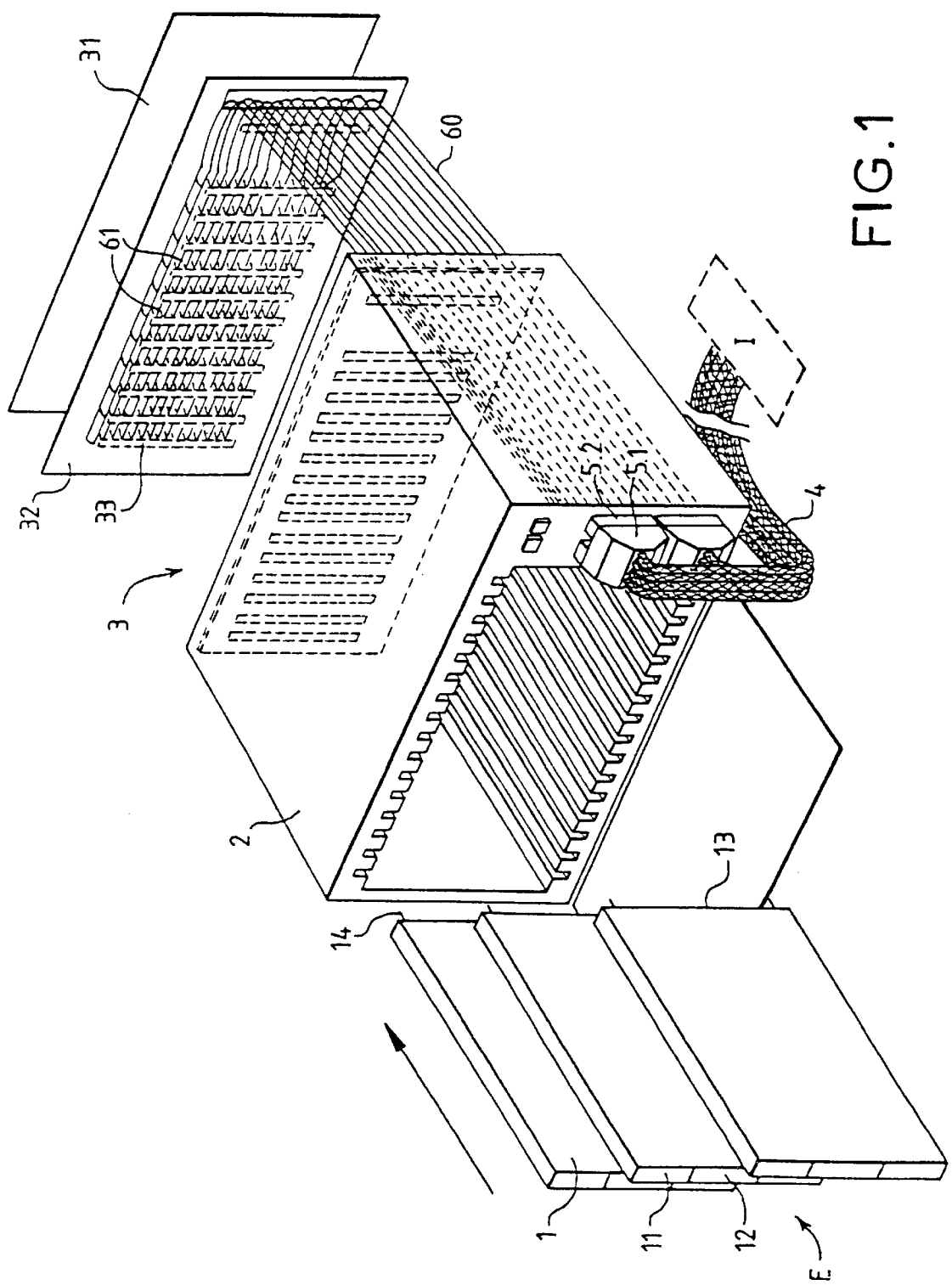

FIG. 1 shows diagrammatically, in exploded view, a connection device for an array E of modular structures of known type. The modular structures 1 are to be slid into the rack 2 in the manner of a drawer. Conventionally, the modular structures 1 are in the form of a casing housing one or more electronic cards (not visible in FIG. 1). Their front face 11 generally has a locking handle 12 (shown schematically) serving for inserting and removing the modular structure 1. Their rear face 13 has one or more multipoint connection blocks 14 connected to the electronic cards. The presence of such connection blocks in FIG. 1 can be imagined.

The connection device occupies the back 3 of the rack 2 and is protected by a cover 31 which is fixed to the rack 2. The connection device comprises at least one so-called backplane circuit 32, which is printed or flexible, provided with connection blocks 33 which project toward the connection blocks 14 on the modular structures 1 when the circuit is in place. These connection blocks 33 are intended to be coupled to those of the modular structures 1.

Bundles of conductors 4 arrive at the front face of the rack 2, they come from the various components of the external installation I shown schematically by a dotted rectangle. These conductors 4 terminate in one or more connection blocks 5.1 which are connected, from the front face of the rack 2, to other connection blocks 5.2. The combination of conductors 4 and connection blocks 5.1, 5.2 take up a large amount of space that cannot be used by the electronics. Between these connection blocks 5.1, 5.2 and the connection blocks 33 there is a very dense network of first conductors 60 which provide a link with the backplane circuit 32.

The backplane circuit 32 accommodates, in addition, second conductors 61 which connect the connection blocks 33 together, when signals have to pass between electronic boards belonging to various modular structures 1.

This type of connection architecture is not easy to design since the density of the conductors 4, 61, 60 is high. In FIG. 1, the thousands of conductors cannot be shown. Between the connectors 5.1, 5.2 and the backplane circuit 32, the first conductors 60 form a bottleneck difficult to implement. Should there be a fault, this is not easy to locate and repair.

The backplane circuit 32 is specific to the rack 2 and another arrangement of modular structures 1 in the rack 2 cannot be envisioned without changing the backplane circuit 32. In addition, the bundles of conductors 4 may constitute an impediment during their return to the external installation I, by running along the side, the top or the underside of the rack 2, while very often this place could be used to affix other racks 2.

The objective of the present invention is especially to solve these connection, maintenance and space-constraint problems.

To achieve this objective, the connection device according to the invention comprises, near the array of modular structures:

a plate provided with openings, terminal connection blocks coming from the external installation, having to be inserted into the openings and each having to be coupled directly to a connection block carried by one of the modular structures and, fastened to the plate, a circuit for distributing signals between modular structures, which is protected from the ambient environment.

The protection from the ambient environment may be accomplished by a cap which covers at least the signal distribution circuit when it is placed between the plate and the cap.

The signal distribution circuit may be immobilized between the plate and the cap by at least one first spacer and at least one second spacer, respectively.

The signal distribution circuit may include at least one conducting termination cooperating with a first-type connection block which has to be directly coupled to a connection block carried by a modular structure of the array, this first-type connection block having to be inserted into an opening in the plate.

When communication with at least one modular structure external to the array is required, the signal distribution circuit includes at least one conducting termination cooperating with a second-type connection block leading to the modular structure external to the array.

The second-type connection block can be inserted into an opening in the cap.

The cap may be made of metal or be metallized in order to protect against electromagnetic interference of the signal distribution circuit.

The terminal connection blocks can be fastened to the plate in order to ensure reliability of the electrical and mechanical connections and to contribute to electrical ground continuity.

Similarly, the second-type connection block can be fastenable to the cap.

To avoid connection errors during fitting, it is preferable for the openings in the plate and the terminal connection blocks to be provided with polarization means.

Above all, if the second-type connection block is similar to the terminal connection blocks, it is preferable for the opening in the cap and the second-type connection block to be provided with polarization means.

The present invention also relates to a rack intended to contain an array of electronic-card-carrying modular structures which is intended to cooperate with a connection device according to the invention. This rack possesses faces among which one that serves as the back, the back housing the plate of the connection device.

To be able to assemble several racks without being impeded by protruding assembly means, at least one of the faces of the rack has at least one recessed external assembly region, this region having to accommodate the assembly means which remain set back or flush with the face after the assembly operation.

One or more of its faces are provided with at least one orifice for cooling the modular structures.

If a large number of modular structures has to be accommodated by it, it is preferable that it contain at least one stiffening partition defining at least two housings for the modular structures (1).

Figure 3:
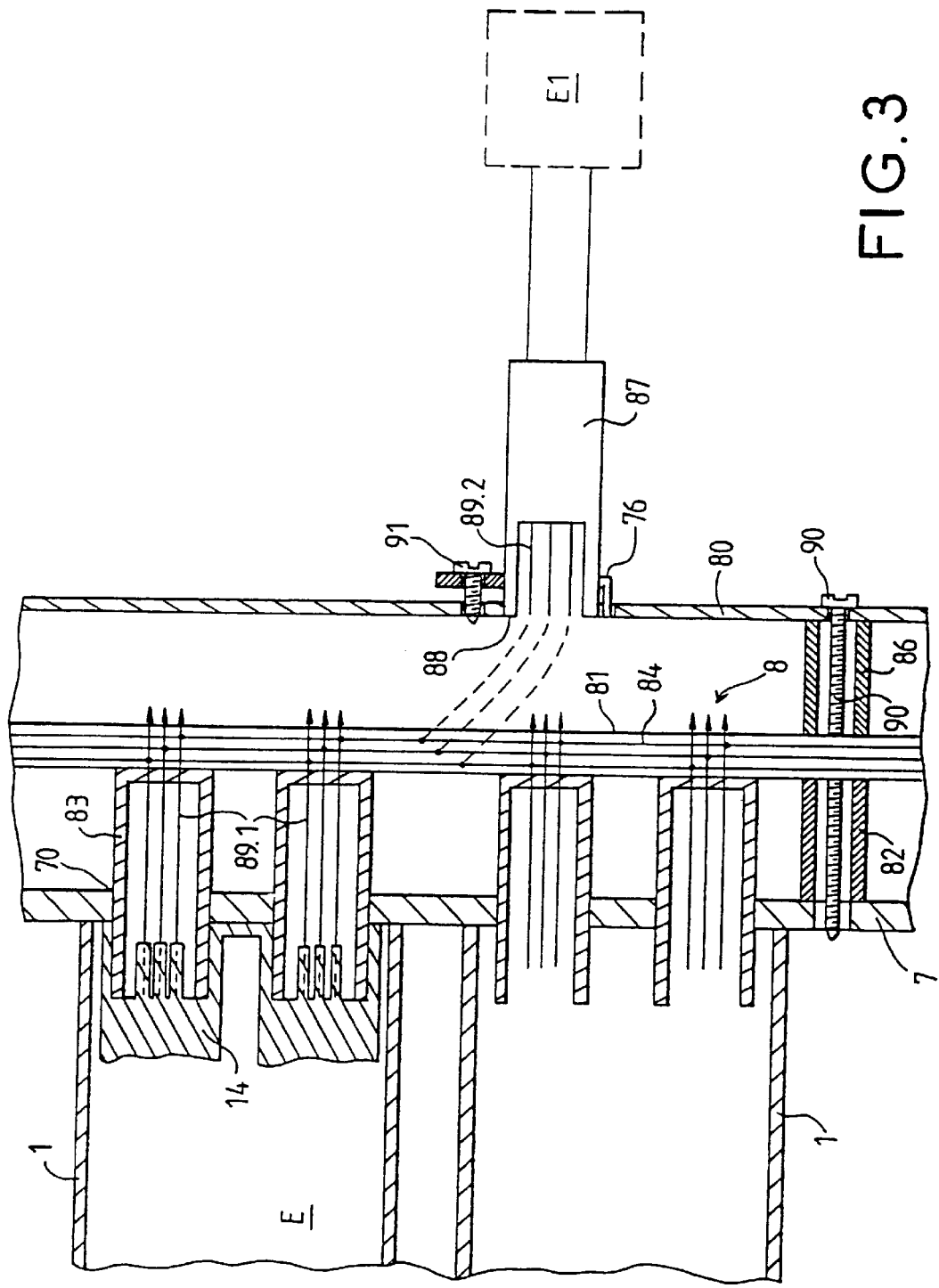
Figure 4:
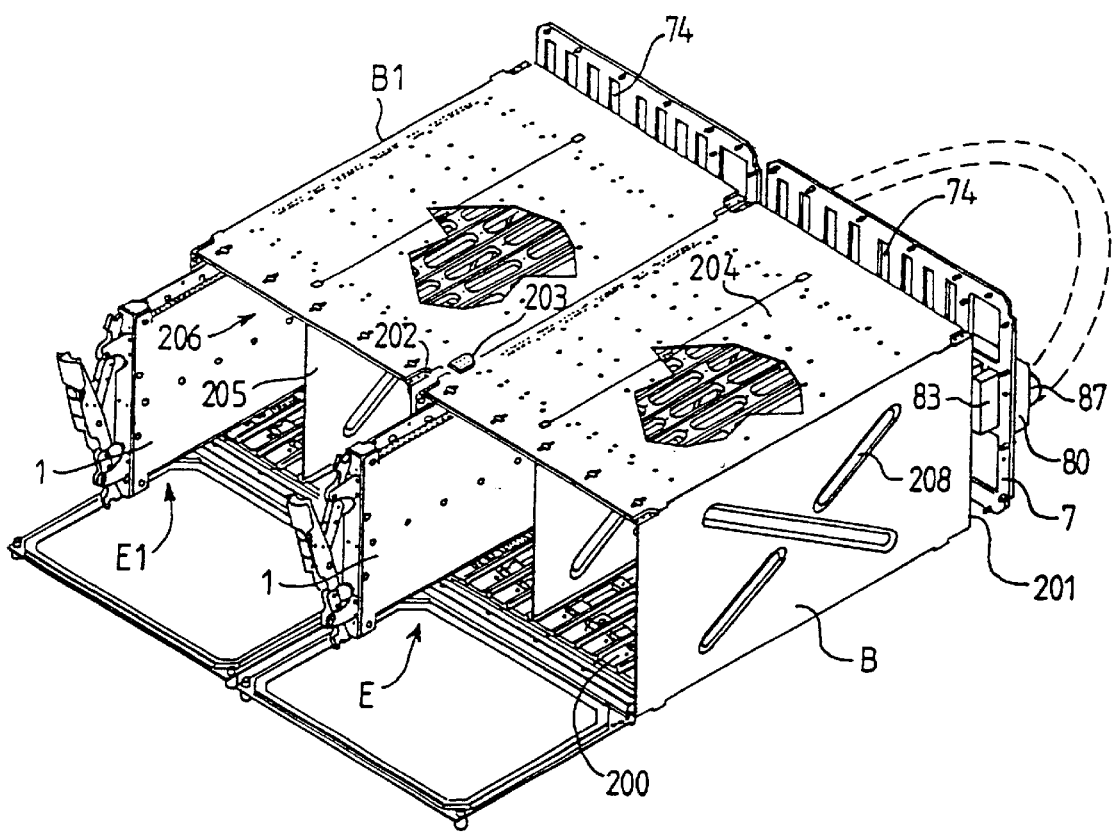

Further features and advantages of the invention will appear on reading the description of illustrative examples of connection and rack devices according to the invention, the description being illustrated by the figures which show:

FIG. 1, already described, an exploded view of a rack accommodating an array of modular structures cooperating with a known connection device;

FIGS. 2a, 2b, 2c, a front view, back view and cross section of a connection device according to the invention, respectively;

FIG. 2d, a plate of the connection device illustrated in FIGS. 2a to 2c, without the terminal connection blocks or the signal distribution circuit;

FIG. 3, a longitudinal section of the signal distribution circuit of a connection device according to the invention;

FIG. 4, an exploded view of two racks according to the invention, ready to be joined together.

In these figures, the same elements bear the same reference and the scales are not necessarily respected for the sake of clarity.

Reference is now made to FIGS. 2.

The connection device according to the invention comprises an apertured plate 7 which may be fastened to the back of a rack intended to accommodate an array E of modular structures 1, similar to that shown in FIG. 1. In FIG. 2c, the rack 2 is shown only in cross section.

The connection device could cooperate with an array of modular structures without the latter being grouped together in a closed rack; it could be reduced to a single holding frame fastened to the plate 7. In all cases, the plate would be close to the array E of modular structures 1.

It is assumed, in the example described, that the plate 7 is fixed to the rack 2 by screws 71 which pass through holes 72 distributed around its perimeter. According to one feature of the invention, the plate 7 has openings 74 intended to support terminal connection blocks 73 of an external installation I with which the modular structures 1 are intended to communicate. The terminal connection blocks 73 are intended to be coupled directly to connection blocks 14 carried by the modular structures 1 of the array E, thereby forming the two parts of a connector. The connection blocks 14 of the modular structures 1 visible in FIG. 2c in dotted lines, are placed in suitable housings in the modular structures 1.

The terminal connection blocks 73 of the external installation I and those 14 belonging to the modular structures 1 may be completely standard, whether they be connection blocks with a plurality of electrical contacts, connection blocks whose contacts are more complex, such as coaxial contacts, or connection blocks for making optical connections, or any other types.

These terminal connection blocks 73 may be shielded from the electromagnetic standpoint and/or sealed with respect to moisture if they are liable to be subjected to a hostile, wet, salty or other, environment.

The terminal connection blocks 73 of the external installation 1 are inserted into the openings 74 in the plate 7. They are provided with a polarization device 76. The polarization device 76 may be of conventional type, for example it may comprise a key with cut faces and integral with the terminal connection block 73, the key being inserted into a positionable and complementary opening in the plate 7.

Each terminal connection block 73 can be fastened into an opening 74 in the plate 7, for this purpose, it includes means 77 for holding it in the opening in the plate 7. These holding means may, for example, be screws 77 and the plate 7 then has holes into which these screws 77 fit. Such holding means ensure reliability of the mechanical and electrical connections and contribute to electrical ground continuity.

On the left-hand side of FIG. 2d may be seen openings 74 of larger area than the openings 74 located on the right-hand side. The terminal connection blocks 73 will have more connection points or less connection points depending on the requirements and especially according to the sizes of the modular structures 1. It is also possible to envision that a large opening 74 accommodates several connection blocks 73.

The connection device also includes, fastened to the plate 7, a circuit 8 for distributing signals between modular structures 1. This signal distribution circuit 8 is protected from the ambient environment.

The signal distribution circuit 8 is not visible in FIGS. 2a, 2b since the protection against the ambient environment is a cap 80 shown instead and this conceals it. The circuit is shown schematically as dotted lines in FIG. 2c.

FIG. 3 shows in greater detail the signal distribution circuit 8 in cross section, seen from above.

The signal distribution circuit 8 is formed by at least one conductor 84 for conveying signals from one modular structure to another. In the figure, the conductor 84 is located on one layer of a multilayer printed circuit 81 which faces the plate 7 and is attached to the latter on the opposite side from the modular structures 1, at a certain distance from the latter, by at least one first spacer 82.

It may be imagined that this signal distribution circuit 8 does not comprise a printed circuit, for example if the conductors 84 are wires or of the optical type.

The signal distribution circuit 8 includes at least one conducting termination 89.1 cooperating with a first-type connection block 83 intended to be coupled directly to a connection block 14 of one of the modular structures 1 of the array E.

The first-type connection block 83 passes through an opening 70 in the plate 7. The first-type connection block 83 may be completely standard and similar to the terminal connection block 73 and the number of connection points that it has is tailored to the requirements.

In the case of an electrical link between the first-type connection block 83 and the distribution circuit 8 in the form of a printed circuit, the conducting termination 89.1 may be a male contact coming from the first-type connection block 83. It is integrated into the first-type connection block 83 and may be attached, for example by soldering, to the conductor 84 of the printed circuit. This description is not limiting— other configurations may be envisioned.

The distribution circuit 8 is fastened to the plate 7, for example by screws 90, in order to prevent any risk of disconnection. The protective cap 80 covers at least the printed circuit 81. It would be conceivable for it to also cover the terminal connection blocks 73. It is held in position with respect to the signal distribution circuit 8 by second spacers 86 and is fastened either to the latter or to the plate 7. In the example described, the same screws 90 serve for holding in place the cap 80, the distribution circuit 8 and the plate 7.

Preferably, the cap 80 is made of metal or is metallized so as to ensure that the signal distribution circuit 8 is protected from electromagnetic interference.

When communication with at least one modular structure external to the array E is required, the signal distribution circuit 8 includes at least one conducting termination 89.2, cooperating with a second-type connection block 87 leading to the modular structure external to the array E. In FIGS. 2c and 3, it is assumed that the communication takes place with a modular structure (not visible) belonging to a second array E1. In FIG. 4, the arrays E, E1 of modular structures are housed in different racks labeled B,. B, respectively.

This second-type connection block 87 passes through an opening 88 in the cap 80. It includes means 91 for holding it to the cap, such as screws for example. In FIG. 3, the conducting termination 89.2 is connected to at least one conductor 84 of the signal distribution circuit 8. The second-type connection block 87 may be standard or similar to the terminal connection blocks 73.

The second-type connection blocks 87 may be provided with polarization means 76, especially when they are similar to the terminal connection blocks 73; these polarization means 76 may be similar to those associated with the terminal connection blocks. The polarization means 76 have been shown schematically in FIG. 3. Errors when fitting are thus avoided.

The present invention also relates to a rack B, B1 intended to house an array E, E1 of modular structures 1 (single modular structure 1 is shown in each array in order not to clutter up the figure) and for cooperating with a connection device according to the invention. FIG. 4 shows two racks B, B1 according to the invention, ready to be joined together. They are in the form of a substantially parallelepipedal mechanical structure with a front face 200 which houses a door and a rear face 201 on the opposite side from the front face 200 which serves as the back - the latter houses the plate 7 of the connection device according to the invention. If the need should arise, the racks B, B1 may have, on at least one of their face [sic] at least one orifice 208 allowing the modular structures 1 to be cooled by circulating air. In FIG. 4, the orifices are referenced on a side face 204.

To be able to join two racks B, B1 together without being impeded by protruding assembly means 203, each of them includes, on at least one of its faces 204, on the outside, at least one recess-configured assembly region 202 for housing therein the assembly means 203. Having completed the assembly operation, the assembly means 203 remain set back or flush with the face 204.

In FIG. 4, the assembly means 203 are in the form of a tab, one end of which is fastened to the first rack B and the other end to the second rack B1, these fastenings being made, for example, by screwing.

Provision may be made, above all if the racks are intended to house a large number of modular structures 1, for the racks to contain at least one internal separating partition 205 defining at least two housings 206 for the modular structures 1. These partitions 205 provide a stiffening function and may also provide a segregation function in the event of fire, an explosion, etc.

Now the modular structures 1 may occupy practically the entire internal volume of the rack B, B1. The space required for the connection device is no longer a drawback since it is relegated to the rear of the modular structures. Compared with modular structures which were connected to the external installation by several levels of backplane circuits, useful area on the cards has been gained depthwise.

The areas on the plate 7 which are occupied by the signal distribution circuit 8 and by the terminal connection blocks 73 can be completely tailored to the requirements, it being possible for the openings to house the connection blocks whatever their type.

Since all the connection blocks may be standard, there is no problem in changing them in the event of a fault and the cost is reduced.

Fitting the terminal connection blocks of the installation 1 is particularly simple and interchangeability facilitates the replacement of one modular structure with another.

The connection device according to the invention makes it possible to interchange two modular structures of the same size without affecting the wiring. There is also an increase in connection reliability since there is no more than one connection link between the electronic cards and the external installation. A grounding and cost saving has also been obtained by the simplification.

What is claimed is:

1. Device for connecting an array of electronic-card-carrying modular structures to an external installation with which a flow of signals can be established, this connection device also providing communication between said modular structures, wherein said device comprises, near the array of said modular structures, a plate provided with openings, terminal connection blocks coming from the installation, each said terminal connection block being configured to be inserted into one of said openings which supports each said terminal connection block and each said terminal connection block being configured to be coupled directly to a modular structure connection block carried by one of said modular structures of the array; and, fastened to the plate, a signal distribution circuit for distributing signals between various modular structures, said circuit being provided with means to protect said circuit from the ambient environment, connected to at least one first-type connection block which is configured to be directly coupled to a block carried by one of said modular structures of the array, this first-type connection block being configured to be inserted into one of said openings in the plate, the openings configured to house the connection blocks whatever their types.

2. Connection device according to claim 1, wherein said means to protect said circuit comprises a protective cap that covers at least the signal distribution circuit placed between the plate and the cap.

3. Connection device according to claim 2, wherein the signal distribution circuit is immobilized between the plate and the cap by at least one first spacer and at least one second spacer, respectively.

4. Connection device according to claim 1, wherein the circuit includes at least one conducting termination cooperating with said first-type connection block.

5. Connection device according to claim 1, wherein, when communication with at least one modular structure external to the array is required, the circuit includes at least one conducting termination cooperating with a second-type connection block leading to the modular structure external to the array.

6. Connection device according to claim 5, wherein the second-type connection block is configured to be inserted into an opening in the cap.

7. Connection device according to claim 2, wherein the cap protects the signal distribution circuit against electromagnetic interference.

8. Connection device according to claim 1, wherein the terminal connection blocks are configured to be fastened to the plate.

9. Connection device according to claim 5, wherein the second-type connection block can be fastened to the cap.

10. Connection device according to claim 1, wherein the openings in the plate and the terminal connection blocks are provided with polarization means.

11. Connection device according to claim 5, wherein the opening in the cap and the second-type connection block are provided with polarization means.

12. Rack configured to contain an array of electronic-card-carrying modular structures having faces among which one of said faces serves as a back, this rack being configured to cooperate with a connection device according to claim 1, wherein the back houses the plate of the connection device.

13. Rack according to claim 2, wherein said rack includes, on at least one of said faces thereof, on an outside thereof, at least one assembly region recessed with respect to said one of said faces, this region being configured to accommodate assembly means when joining said rack to another rack, the assembly means remaining set back or flush with the face after the assembly operation.

14. Rack according to claim 12, wherein one or more of said faces of said rack are provided with at least one orifice for cooling the modular structures.

15. Rack according to claim 12, wherein said rack comprises at least one stiffening partition defining at least two housings for the modular structures.

* * * * *